United States Patent
Camacho et al.

(10) Patent No.: US 8,035,207 B2
(45) Date of Patent: Oct. 11, 2011

(54) STACKABLE INTEGRATED CIRCUIT PACKAGE SYSTEM WITH RECESS

(75) Inventors: Zigmund Ramirez Camacho, Singapore (SG); Henry D. Bathan, Singapore (SG); Jose Alvin Caparas, Singapore (SG); Lionel Chien Hui Tay, Singapore (SG)

(73) Assignee: Stats Chippac Ltd., Singapore (SG)

( * ) Notice: Subject to any disclaimer, the term of this patent is extended or adjusted under 35 U.S.C. 154(b) by 606 days.

(21) Appl. No.: 11/618,807

(22) Filed: Dec. 30, 2006

(65) Prior Publication Data

US 2008/0157321 A1 Jul. 3, 2008

(51) Int. Cl.
  *H01L 23/02* (2006.01)
(52) U.S. Cl. ........ 257/678; 257/686; 257/690; 257/693; 257/713; 257/680; 438/106; 438/109; 438/112; 438/123; 438/127
(58) Field of Classification Search .......... 257/666–733; 438/106–127
  See application file for complete search history.

(56) References Cited

U.S. PATENT DOCUMENTS

| | | |
|---|---|---|
| 5,227,662 A | 7/1993 | Ohno et al. |
| 5,334,872 A | 8/1994 | Ueda et al. |
| 5,363,279 A | 11/1994 | Cha |
| 5,558,267 A | 9/1996 | Humphrey et al. |
| 5,801,439 A * | 9/1998 | Fujisawa et al. ............. 257/686 |
| 5,821,615 A | 10/1998 | Lee |
| 5,835,988 A * | 11/1998 | Ishii .............................. 257/684 |
| 5,861,668 A | 1/1999 | Cha |
| 5,866,939 A | 2/1999 | Shin et al. |
| 5,963,433 A | 10/1999 | Kim |
| 6,020,625 A | 2/2000 | Qin et al. |
| 6,319,753 B1 * | 11/2001 | Ichikawa et al. ............. 438/112 |
| 6,414,385 B1 * | 7/2002 | Huang et al. ................. 257/690 |
| 6,424,031 B1 * | 7/2002 | Glenn .......................... 257/686 |
| 6,552,416 B1 | 4/2003 | Foster |
| 6,798,046 B1 | 9/2004 | Miks |
| 6,825,551 B1 | 11/2004 | Do Bento Vieira |
| 6,977,431 B1 | 12/2005 | Oh et al. |
| 7,019,389 B2 | 3/2006 | Lai et al. |
| 7,061,079 B2 | 6/2006 | Weng et al. |
| 7,102,210 B2 | 9/2006 | Ichikawa |
| 7,122,884 B2 | 10/2006 | Cabahug et al. |
| 2002/0084519 A1 | 7/2002 | Choi et al. |
| 2002/0121680 A1 | 9/2002 | Ahn et al. |
| 2005/0046002 A1 | 3/2005 | Lee et al. |
| 2005/0224924 A1 | 10/2005 | Koh et al. |
| 2006/0180904 A1 * | 8/2006 | Ong ............................. 257/676 |

* cited by examiner

*Primary Examiner* — Zandra Smith
*Assistant Examiner* — Telly Green
(74) *Attorney, Agent, or Firm* — Mikio Ishimaru

(57) ABSTRACT

A stackable integrated circuit package system is provided including forming an external interconnect having an interconnect non-recessed portion and an interconnect recessed portion, mounting an integrated circuit die over a paddle that is coplanar with the interconnect recessed portion, and forming an encapsulation having a recess over the external interconnect and the integrated circuit die with the external interconnect exposed at a side of the encapsulation.

20 Claims, 12 Drawing Sheets

STACKABLE INTEGRATED CIRCUIT PACKAGE SYSTEM WITH RECESS

CROSS-REFERENCE TO RELATED APPLICATION

The present application contains subject matter related to co-pending U.S. patent application Ser. No. 11/164,088 filed Nov. 10, 2005. The related application is assigned to STATS ChipPAC Ltd.

TECHNICAL FIELD

The present invention relates generally to wafer manufacturing system and more particularly to semiconductor manufacturing system.

BACKGROUND ART

Integrated circuit packaging technology has seen an increase in the number of integrated circuits mounted on a single circuit board or substrate. The new packaging designs are more compact in form factors, such as the physical size and shape of an integrated circuit, and providing a significant increase in overall integrated circuit density. However, integrated circuit density continues to be limited by the "real estate" available for mounting individual integrated circuits on a substrate. Even larger form factor systems, such as personal computers, compute servers, and storage servers, need more integrated circuits in the same or smaller "real estate". Particularly acute, the needs for portable personal electronics, such as cell phones, digital cameras, music players, personal digital assistants, and location-based devices, have further driven the need for integrated circuit density.

This increased integrated circuit density has led to the development of multi-chip packages in which more than one integrated circuit can be packaged. Each package provides mechanical support for the individual integrated circuits and one or more layers of interconnect lines that enable the integrated circuits to be connected electrically to surrounding circuitry. Current multi-chip packages, also commonly referred to as multi-chip modules, typically consist of a substrate onto which a set of separate integrated circuit components are attached. Such multi-chip packages have been found to increase integrated circuit density and miniaturization, improve signal propagation speed, reduce overall integrated circuit size and weight, improve performance, and lower costs—all primary goals of the computer industry.

However, such multi-chip modules can be bulky. Integrated circuit package density is determined by the area required to mount a die or module on a circuit board. One method for reducing the board size of multi-chip modules and thereby increase their effective density is to stack the die or chips vertically within the module or package.

Multi-chip packages with stacking configurations may also present problems. Spacer structures may be used to create space for electrical connections in the stacked structure. Package-in-package structures contain packaged integrated circuits in the stacked structures. Typical spacer structures and the encapsulation material of the packaged integrated circuits have low adhesion and become a source of delamination. Conventional spacer and packaged integrated circuits interface perform poorly in reliability test from the delamination at this interface.

Other approaches for multi-chip packages combine several semiconductor die and associated passive components ("passives") side by side in a single, horizontal layer. Combining them into a single horizontal layer used board space inefficiently by consuming large no-lead leadframe areas, and afforded less advantage in circuit miniaturization.

However, multi-chip modules, whether vertically or horizontally arranged, can also present problems because they usually must be assembled before the component chips and chip connections can be tested. That is, because the electrical bond pads on a die are so small, it is difficult to test die before assembly onto a no-lead leadframe. Thus, when die are mounted and connected individually, the die and connections can be tested individually, and only known-good-die ("KGD") that is free of defects is then assembled into larger circuits. A fabrication process that uses KGD is therefore more reliable and less prone to assembly defects introduced due to bad die. With conventional multi-chip modules, however, the die cannot be individually identified as KGD before final assembly, leading to KGD inefficiencies and assembly process problems including yield.

Despite recent developments in semiconductor fabrication and packaging techniques, there is a continuing need for improved packaging methods, systems, and designs for increasing semiconductor die density in PCB assemblies.

Thus, a need still remains for a stackable integrated circuit package system providing low cost manufacturing, improved yield, and thinner height for the integrated circuits. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a stackable integrated circuit package system including forming an external interconnect having an interconnect non-recessed portion and an interconnect recessed portion, mounting an integrated circuit die over a paddle that is coplanar with the interconnect recessed portion, and forming an encapsulation having a recess over the external interconnect and the integrated circuit die with the external interconnect exposed at a side of the encapsulation.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
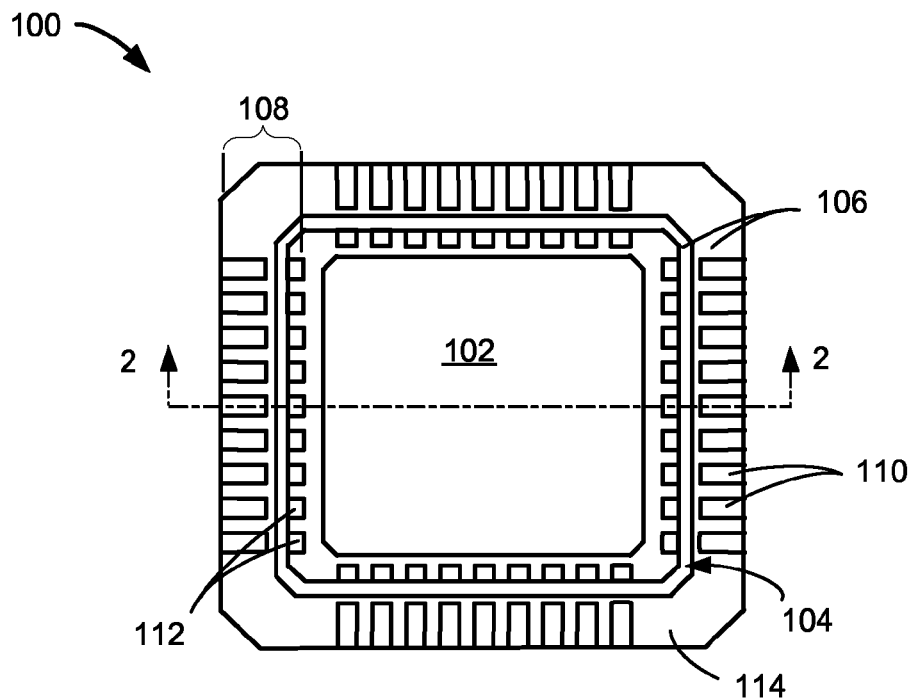
FIG. 1 is a bottom view of a stackable integrated circuit package system in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. In addition, where multiple embodiments are disclosed and described having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIG. 1, therein is shown a bottom view of a stackable integrated circuit package system 100 in an embodiment of the present invention. The stackable integrated circuit package system 100 may represent a number of different integrated circuit package systems, such as a quad flat nonleaded (QFN) package. The bottom view depicts a paddle 102, such as a die-attach paddle, a heat sink, or an electromagnetic interference (EMI) shield. The paddle 102 is in a recess 104 of the stackable integrated circuit package system 100. An encapsulation 106, such as an epoxy mold compound, of the stackable integrated circuit package system 100 exposes the paddle 102.

The encapsulation 106 exposes external interconnects 108, such as leads. The bottom view depicts that each of the external interconnects 108 has an interconnect non-recessed portion 110 and an interconnect recessed portion 112. The interconnect non-recessed portion 110 is exposed at sides 114 of the encapsulation 106. The encapsulation 106 exposes a portion of the interconnect recessed portion 112 within the recess 104. The encapsulation 106 also exposes the interconnect non-recessed portion 110. The recess 104 within the encapsulation 106 exposes the paddle 102.

For illustrative purposes, the external interconnects 108 are shown in a single row configuration, although it is understood that the external interconnects 108 may be in a different configuration, such as a dual row configuration. Also for illustrative purposes, the encapsulation 106 exposes both the interconnect non-recessed portion 110 and the interconnect recessed portion 112, although it is understood that the encapsulation 106 may not expose both the interconnect non-recessed portion 110 and the interconnect recessed portion 112 for each of the external interconnects 108.

The interconnect non-recessed portion 110 and the interconnect recessed portion 112 may provide, both or individually, connection sites for further connections. The paddle 102 may be connected to a ground level allowing the paddle 102 to function as an electromagnetic interference (EMI) shield. The paddle 102 may also be connected to a system level heat sink (not shown), such as a heat slug or a printed circuit board, allowing the paddle 102 to function as a heat sink or heat spreader.

Figure 2:
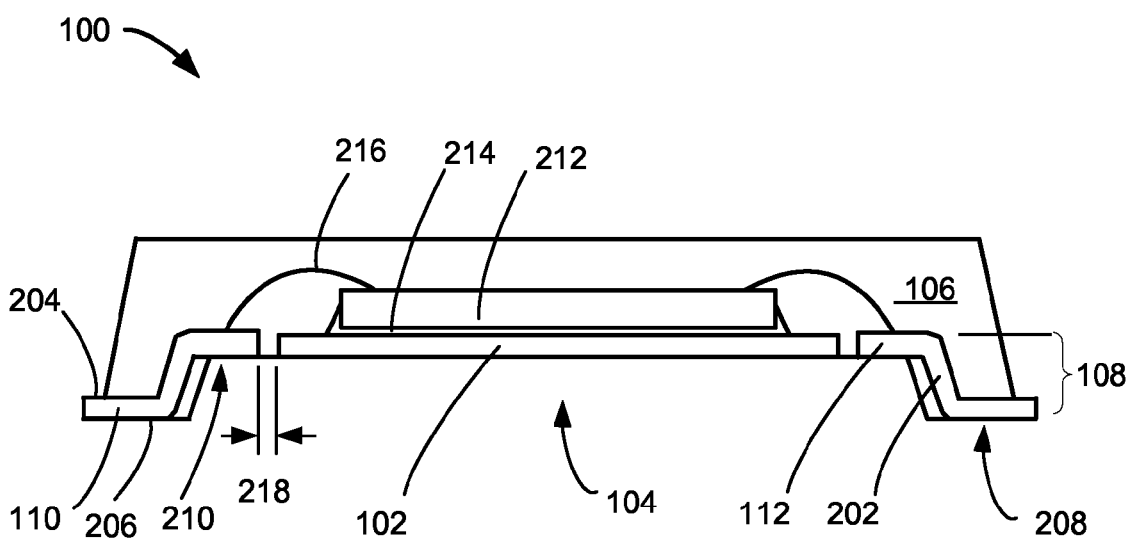
FIG. 2 is a cross-sectional view of the stackable integrated circuit package system along 2-2 of FIG. 1.

Referring now to FIG. 2, therein is shown a cross-sectional view of the stackable integrated circuit package system 100 along 2-2 of FIG. 1. The cross-sectional view depicts the paddle 102 between the external interconnects 108. Each of the external interconnects 108 has an interconnect transition portion 202, such as a downset portion, between the interconnect non-recessed portion 110 and the interconnect recessed portion 112. The interconnect non-recessed portion 110 is below the interconnect recessed portion 112. The paddle 102 is substantially coplanar with the interconnect recessed portion 112.

The cross-sectional view also depicts the encapsulation 106 covering a first surface 204 of the external interconnects 108. The first surface 204 includes a planar first non-recessed surface of the non-recessed portion 110. A portion of the planar first non-recessed surface near ends of the external interconnects 108 is exposed from the encapsulation 106 and a coplanar portion of the planar first non-recessed surface away from the ends is covered by the encapsulation 106. The external interconnects 108 have a second surface 206 at a side opposite the first surface 204. The second surface 206 may be further described with a non-recessed surface 208 and a recessed surface 210. The non-recessed surface 208 is along the interconnect non-recessed portion 110. The recessed surface 210 is along the interconnect recessed portion 112.

The cross-sectional view further depicts that the encapsulation 106 exposes the non-recessed surface 208 and a portion of the recessed surface 210. The encapsulation 106 covers of the interconnect transition portion 202 and a portion of the recessed surface 210 adjacent to the interconnect transition portion 202.

The encapsulation 106 at the interconnect transition portion 202 serves multiple functions. For example, the encapsulation 106 provides additional mechanical support to the external interconnects 108. The interconnect transition portion 202 helps from mold interlocks. Mold interlocks help mitigate or eliminate delamination of the encapsulation 106 improving reliability performance, such as in moisture sensitivity level (MSL) or moisture resistance test (MRT).

An integrated circuit die 212 mounts on the paddle 102 with an adhesive 214, such as a die-attach adhesive. The encapsulation 106 exposes a side of the paddle 102 opposite the integrated circuit die 212. Internal interconnects 216, such as bond wires or ribbon bond wires, connect the integrated circuit die 212 and the external interconnects 108.

The encapsulation 106 also covers the integrated circuit die 212 and the internal interconnects 216. The encapsulation 106 also fills gaps 218 between the external interconnects 108 and the paddle 102, wherein the encapsulation 106 do not enter the recess 104 from the gaps 218. The encapsulation 106 is formed over the external interconnects 108 and the integrated circuit die 212 with only portions of the ends of the external interconnects 108 exposed.

Figure 3:
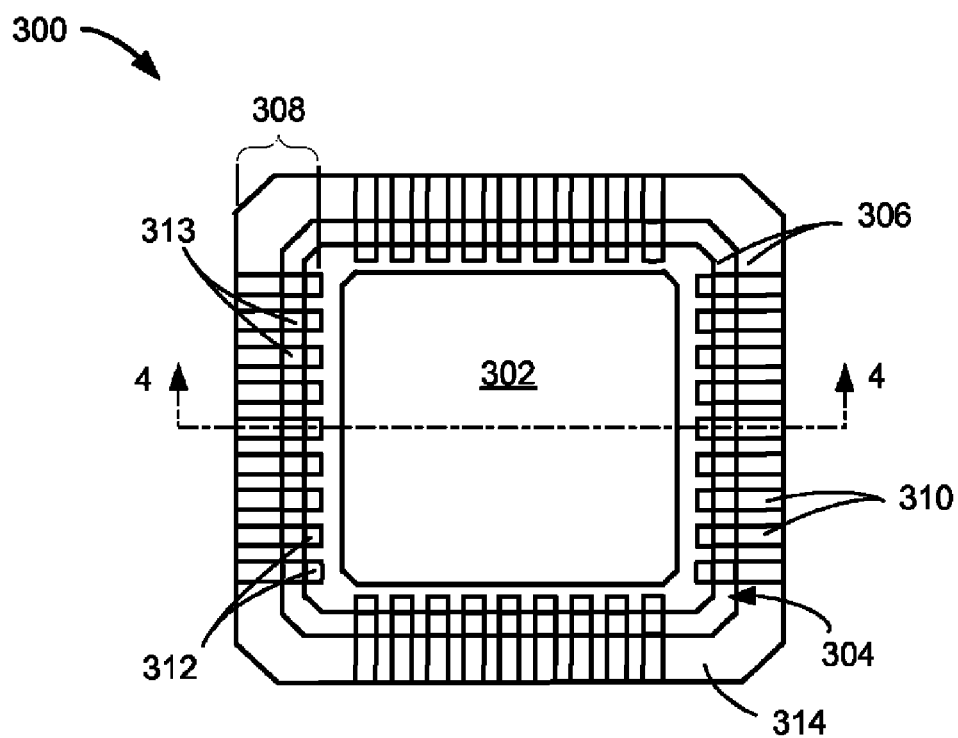
FIG. 3 is a bottom view of a stackable integrated circuit package system in an alternative embodiment of the present invention.

Referring now to FIG. 3, therein is shown a bottom view of a stackable integrated circuit package system 300 in an alternative embodiment of the present invention. The stackable integrated circuit package system is similar in structure with the stackable integrated circuit package system 100 of FIG. 1. The bottom view depicts a paddle 302, such as a die-attach paddle, a heat sink, or an electromagnetic interference (EMI) shield. The paddle 302 is in a recess 304 of the stackable integrated circuit package system 300. An encapsulation 306, such as an epoxy mold compound, of the stackable integrated circuit package system 300 exposes the paddle 302.

The encapsulation 306 exposes external interconnects 308, such as leads. The bottom view depicts that each of the external interconnects 308 has an interconnect non-recessed portion 310, an interconnect recessed portion 312, and an interconnect transition portion 313. The interconnect transition portion 313 is between the interconnect non-recessed portion 310 and the interconnect recessed portion 312. The interconnect non-recessed portion 310 is exposed at sides 314 of the encapsulation 306.

The interconnect non-recessed portion 310, the interconnect recessed portion 312, and the interconnect transition portion 313 may provide, collectively or individually, connection sites for further connections. The paddle 302 may be connected to a ground level allowing the paddle 302 to function as an electromagnetic interference (EMI) shield. The paddle 302 may also be connected to a system level heat sink (not shown), such as a heat slug or a printed circuit board, allowing the paddle 302 to function as a heat sink or heat spreader.

Figure 4:
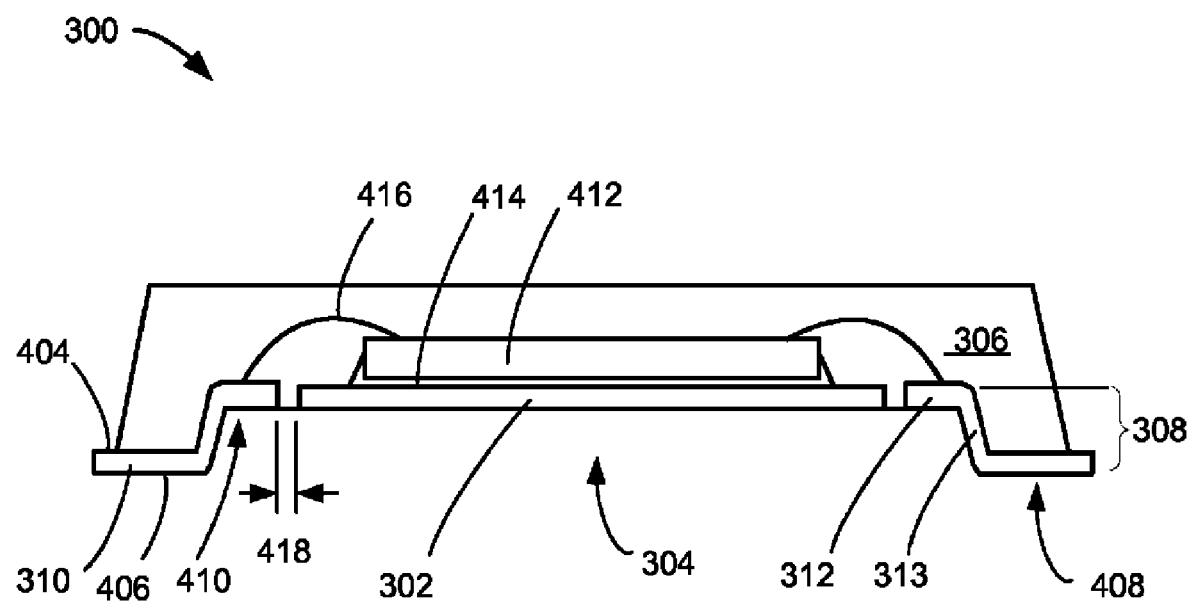
FIG. 4 is a cross-sectional view of the stackable integrated circuit package system along 4-4 of FIG. 3.

Referring now to FIG. 4, therein is shown a cross-sectional view of the stackable integrated circuit package system 300 along 4-4 of FIG. 3. The cross-sectional view depicts the paddle 302 between the external interconnects 308. The interconnect transition portion 313 is between the interconnect non-recessed portion 310 and the interconnect recessed portion 312. The interconnect non-recessed portion 310 is below the interconnect recessed portion 312. The paddle 302 is substantially coplanar with the interconnect recessed portion 312.

The cross-sectional view also depicts the encapsulation 306 covering a first surface 404 of the external interconnects 308. The cross-sectional view further depicts that the encapsulation 306 exposes a second surface 406 of the external interconnects 308, wherein the second surface 406 is a surface opposite the first surface 404.

An integrated circuit die 412 mounts on the paddle 302 with an adhesive 414, such as a die-attach adhesive. The encapsulation 306 exposes a side of the paddle 302 opposite the integrated circuit die 412. Internal interconnects 416, such as bond wires or ribbon bond wires, connect the integrated circuit die 412 and the external interconnects 308.

The encapsulation 306 also covers the integrated circuit die 412 and the internal interconnects 416. The encapsulation 306 also fills gaps 418 between the external interconnects 308 and the paddle 302, wherein the encapsulation 306 do not enter the recess 304 from the gaps 418.

Figure 5:
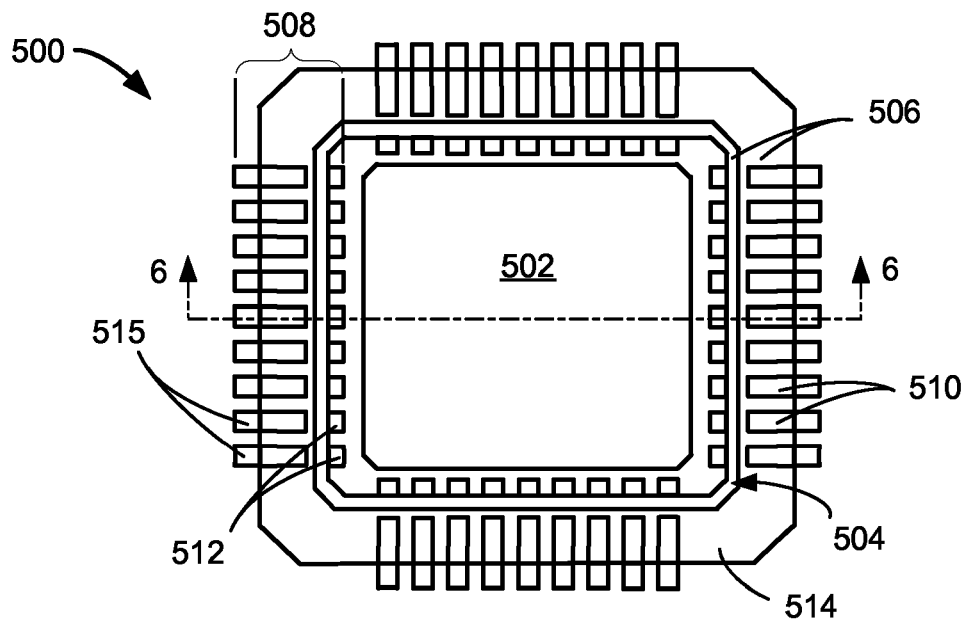
FIG. 5 is a bottom view of a stackable integrated circuit package system in another alternative embodiment of the present invention.

Referring now to FIG. 5, therein is shown a bottom view of a stackable integrated circuit package system 500 in another alternative embodiment of the present invention. The bottom view depicts a paddle 502, such as a die-attach paddle, a heat sink, or an electromagnetic interference (EMI) shield. The paddle 502 is in a recess 504 of the stackable integrated circuit package system 500. An encapsulation 506, such as an epoxy mold compound, of the stackable integrated circuit package system 500 exposes the paddle 502.

External interconnects 508, such as leads, peripherally extend from the encapsulation 506. The bottom view depicts that each of the external interconnects 508 has an interconnect non-recessed portion 510, an interconnect recessed portion 512, and an interconnect curved portion 515. The interconnect non-recessed portion 510 peripherally extends beyond sides 514 of the encapsulation 506. The interconnect curved portion 515 extends peripherally from the interconnect non-recessed portion 510. The encapsulation 506 exposes a portion of the interconnect recessed portion 512 within the recess 504. The encapsulation 506 also exposes the interconnect non-recessed portion 510.

For illustrative purposes, the external interconnects 508 are shown in a single row configuration, although it is understood that the external interconnects 508 may be in a different configuration, such as a dual row configuration. Also for illustrative purposes, the encapsulation 506 exposes both the interconnect non-recessed portion 510 and the interconnect recessed portion 512, although it is understood that the encapsulation 506 may not expose both the interconnect non-recessed portion 510 and the interconnect recessed portion 512 for each of the external interconnects 508.

The interconnect non-recessed portion 510, the interconnect recessed portion 512, and the interconnect curved portion 515 may provide, collectively or individually, connection sites for further connections. The paddle 502 may be connected to a ground level allowing the paddle 502 to function as an electromagnetic interference (EMI) shield. The paddle 502 may also be connected to a system level heat sink (not shown), such as a heat slug or a printed circuit board, allowing the paddle 502 to function as a heat sink or heat spreader.

Figure 6:
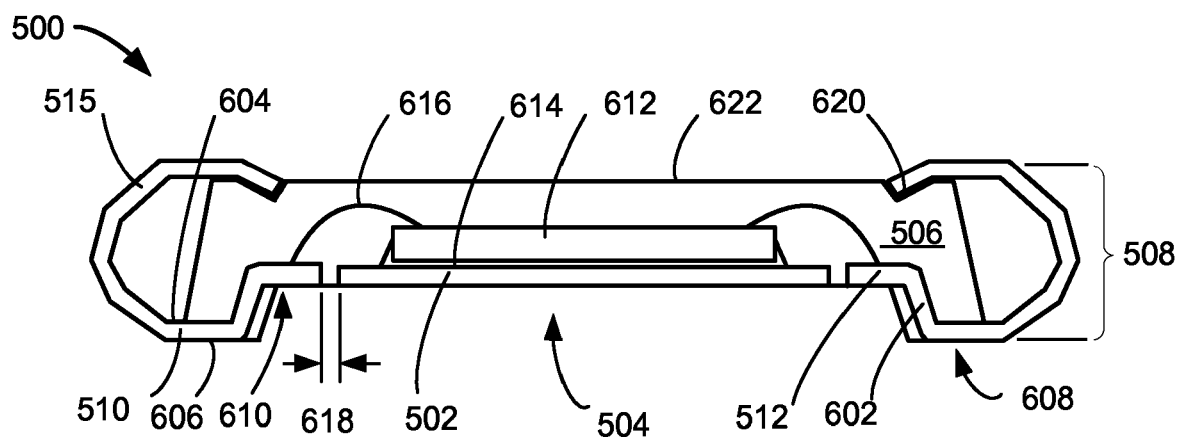
FIG. 6 is a cross-sectional view of the stackable integrated circuit package system along 6-6 of FIG. 5.

Referring now to FIG. 6, therein is a cross-sectional view of the stackable integrated circuit package system 500 along 6-6 of FIG. 5. The cross-sectional view depicts the paddle 502 between the external interconnects 508. Each of the external interconnects 508 has an interconnect transition portion 602 between the interconnect non-recessed portion 510 and the interconnect recessed portion 512. The interconnect non-recessed portion 510 is below the interconnect recessed portion 512. The paddle 502 is substantially coplanar with the interconnect recessed portion 512.

The cross-sectional view also depicts the encapsulation 506 covering a first surface 604 of the external interconnects 508 except for the interconnect curved portion 515. The external interconnects 508 have a second surface 606 at a side opposite the first surface 604. The second surface 606 may be further described with a non-recessed surface 608 and a recessed surface 610. The non-recessed surface 608 is along the interconnect non-recessed portion 510. The recessed surface 610 is along the interconnect recessed portion 512.

The cross-sectional view further depicts that the encapsulation 506 exposes the non-recessed surface 608 and a portion of the recessed surface 610. The encapsulation 506 covers of the interconnect transition portion 602 and a portion of the recessed surface 610 adjacent to the interconnect transition portion 602.

The encapsulation 506 at the interconnect transition portion 602 serves multiple functions. For example, the encapsulation 506 provides additional mechanical support to the external interconnects 508. The interconnect transition portion 602 helps from mold interlocks. Mold interlocks help mitigate or eliminate delamination of the encapsulation 506 improving reliability performance, such as in moisture sensitivity level (MSL) or moisture resistance test (MRT).

An integrated circuit die 612 mounts on the paddle 502 with an adhesive 614, such as a die-attach adhesive. The encapsulation 506 exposes a side of the paddle 502 opposite the integrated circuit die 612. Internal interconnects 616, such as bond wires or ribbon bond wires, connect the integrated circuit die 612 and the external interconnects 508.

The encapsulation 506 also covers the integrated circuit die 612 and the internal interconnects 616. The encapsulation 506 also fills gaps 618 between the external interconnects 508 and the paddle 502, wherein the encapsulation 506 do not enter the recess 504 from the gaps 618. The encapsulation 506 has notches 620 from a horizontal side 622 of the encapsulation 506 for locking in and supporting the interconnect curved portion 515 of the external interconnects 508. The interconnect curved portion 515 bends from the interconnect non-recessed portion 510 to over the encapsulation 506 and into the notches 620. The interconnect curved portion 515 may provide connection sites. The encapsulation 506 and the notches 620 may allow the external interconnects 508 to provide resilient connections.

Figure 7:
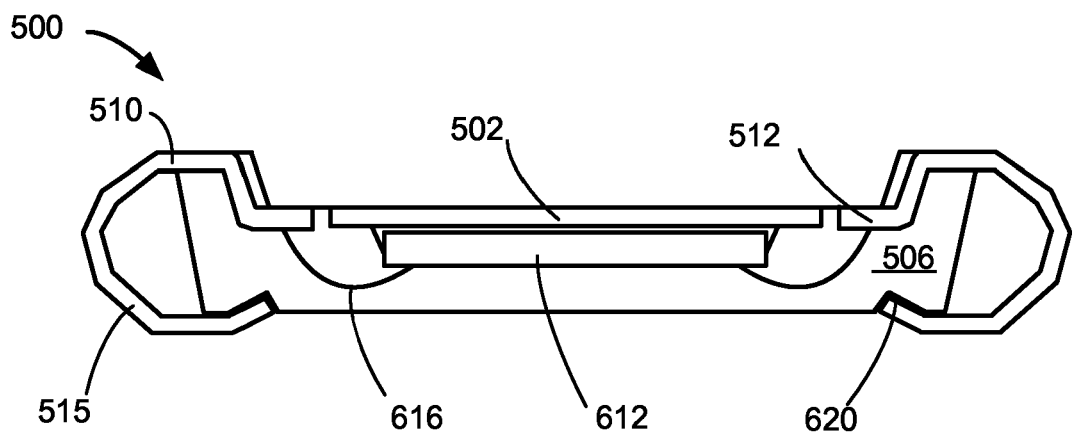
FIG. 7 is a cross-sectional view of the stackable integrated circuit package system of FIG. 6 in an inverted orientation.

Referring now to FIG. 7, therein is shown a cross-sectional view of the stackable integrated circuit package system 500 of FIG. 6 in an inverted orientation. The cross-sectional view depicts the paddle 502 above the integrated circuit die 612 and the internal interconnects 616. The encapsulation 506 exposes the interconnect non-recessed portion 510 and the interconnect curved portion 515 for further connections. The encapsulation 506 also exposes a portion of the interconnect recessed portion 512. The interconnect curved portion 515 are in the notches 620 and supported by the encapsulation 506.

Figure 8:
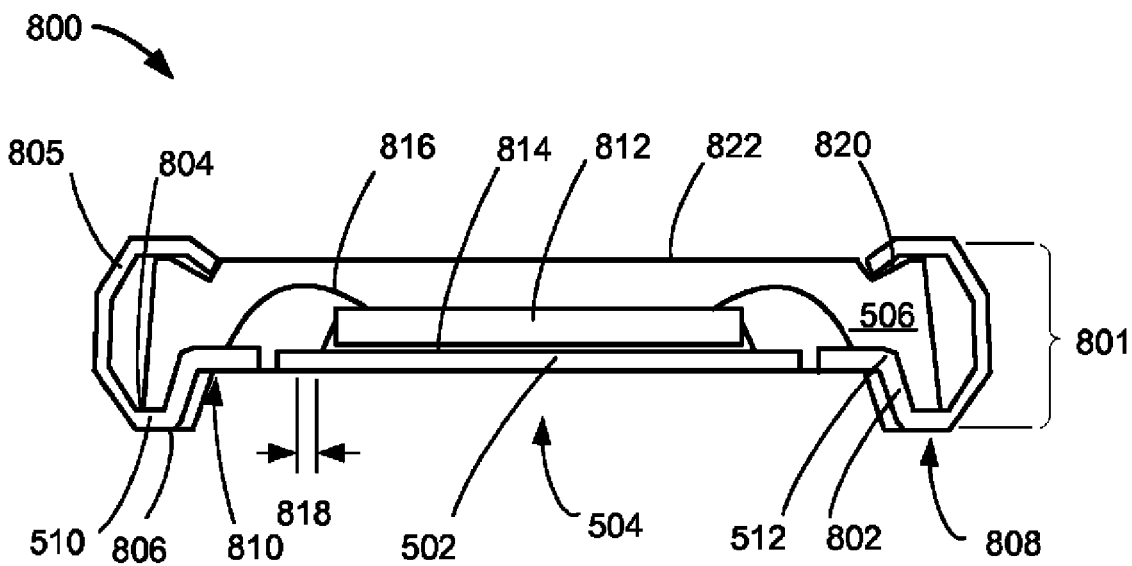
FIG. 8 is a cross-sectional view of a stackable integrated circuit package system along 6-6 of FIG. 5 in yet another alternative embodiment of the present invention.

Referring now to FIG. 8, therein is shown a cross-sectional view of a stackable integrated circuit package system 800 along 6-6 of FIG. 5 in yet another alternative embodiment of the present invention. The bottom view of the stackable integrated circuit package system 500 of FIG. 5 may represent the bottom view of the stackable integrated circuit package system 800.

The cross-sectional view depicts the paddle 502 between external interconnects 801, such as leads. The external interconnects 801 are represented as the external interconnects 508 of FIG. 5. Each of the external interconnects 801 has an interconnect transition portion 802 between the interconnect non-recessed portion 510 and the interconnect recessed portion 512. The interconnect non-recessed portion 510 is below the interconnect recessed portion 512. The paddle 502 is substantially coplanar with the interconnect recessed portion 512.

The cross-sectional view also depicts the encapsulation 506 covering a first surface 804 of the external interconnects 801 except for an interconnect curved portion 805. The external interconnects 801 have a second surface 806 at a side opposite the first surface 804. The second surface 806 may be further described with a non-recessed surface 808 and a recessed surface 810. The non-recessed surface 808 is along the interconnect non-recessed portion 510. The recessed surface 810 is along the interconnect recessed portion 512.

The cross-sectional view further depicts that the encapsulation 506 exposes the non-recessed surface 808 and a portion of the recessed surface 810. The encapsulation 506 covers of the interconnect transition portion 802 and a portion of the recessed surface 810 adjacent to the interconnect transition portion 802.

The encapsulation 506 at the interconnect transition portion 802 serves multiple functions. For example, the encapsulation 506 provides additional mechanical support to the external interconnects 801. The interconnect transition portion 802 helps from mold interlocks. Mold interlocks help mitigate or eliminate delamination of the encapsulation 506 improving reliability performance, such as in moisture sensitivity level (MSL) or moisture resistance test (MRT).

An integrated circuit die 812 mounts on the paddle 502 with an adhesive 814, such as a die-attach adhesive. The encapsulation 506 exposes a side of the paddle 502 opposite the integrated circuit die 812. Internal interconnects 816, such as bond wires or ribbon bond wires, connect the integrated circuit die 812 and the external interconnects 801.

The encapsulation 506 also covers the integrated circuit die 812 and the internal interconnects 816. The encapsulation 506 also fills gaps 818 between the external interconnects 801 and the paddle 502, wherein the encapsulation 506 do not enter the recess 504 from the gaps 818. The encapsulation 506 has notches 820 from a horizontal side 822 of the encapsulation 506 for locking in and supporting the interconnect curved portion 805 of the external interconnects 801. The interconnect curved portion 805 bends from the interconnect non-recessed portion 510 to over the encapsulation 506 and into the notches 820. The interconnect curved portion 805 may provide connection sites. The encapsulation 506 and the notches 820 may allow the external interconnects 801 to provide resilient connections.

The interconnect curved portion 805 is represented as the interconnect curved portion 515 of FIG. 5. The interconnect curved portion 805 is not as rounded as the interconnect curved portion 515. For illustrative purposes, the interconnect curved portion 805 is shown as a curved portion of the external interconnects 801, although it is understood that the interconnect curved portion 805 may have a different configuration, such as a curve with different arc lengths or bent segments.

Figure 9:
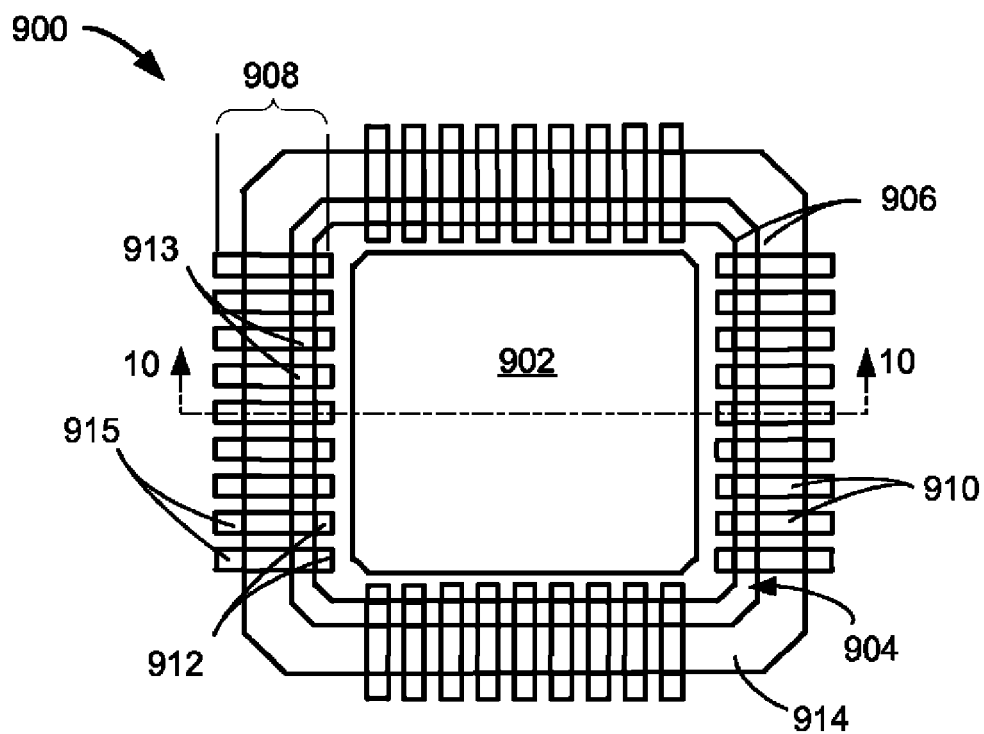
FIG. 9 is a bottom view of a stackable integrated circuit package system in yet another alternative embodiment of the present invention.

Referring now to FIG. 9, therein is shown a bottom view of a stackable integrated circuit package system 900 in yet another alternative embodiment of the present invention. The stackable integrated circuit package system 900 is similar in structure to the stackable integrated circuit package system 500 of FIG. 5. The bottom view depicts a paddle 902, such as a die-attach paddle, a heat sink, or an electromagnetic interference (EMI) shield. The paddle 902 is in a recess 904 of the stackable integrated circuit package system 900. An encapsulation 906, such as an epoxy mold compound, of the stackable integrated circuit package system 900 exposes the paddle 902.

External interconnects 908, such as leads, peripherally extend from the encapsulation 906. The bottom view depicts that each of the external interconnects 908 has an interconnect non-recessed portion 910, an interconnect recessed portion 912, an interconnect transition portion 913, and an interconnect curved portion 915. The interconnect non-recessed portion 910 peripherally extends beyond sides 914 of the encapsulation 906. The interconnect curved portion 915 extends peripherally from the interconnect non-recessed portion 910. The encapsulation 906 exposes the external interconnects 908.

The interconnect non-recessed portion 910, the interconnect recessed portion 912, the interconnect transition portion 913, and the interconnect curved portion 915 may provide, collectively or individually, connection sites for further connections. The paddle 902 may be connected to a ground level allowing the paddle 902 to function as an electromagnetic interference (EMI) shield. The paddle 902 may also be connected to a system level heat sink (not shown), such as a heat slug or a printed circuit board, allowing the paddle 902 to function as a heat sink or heat spreader.

Figure 10:
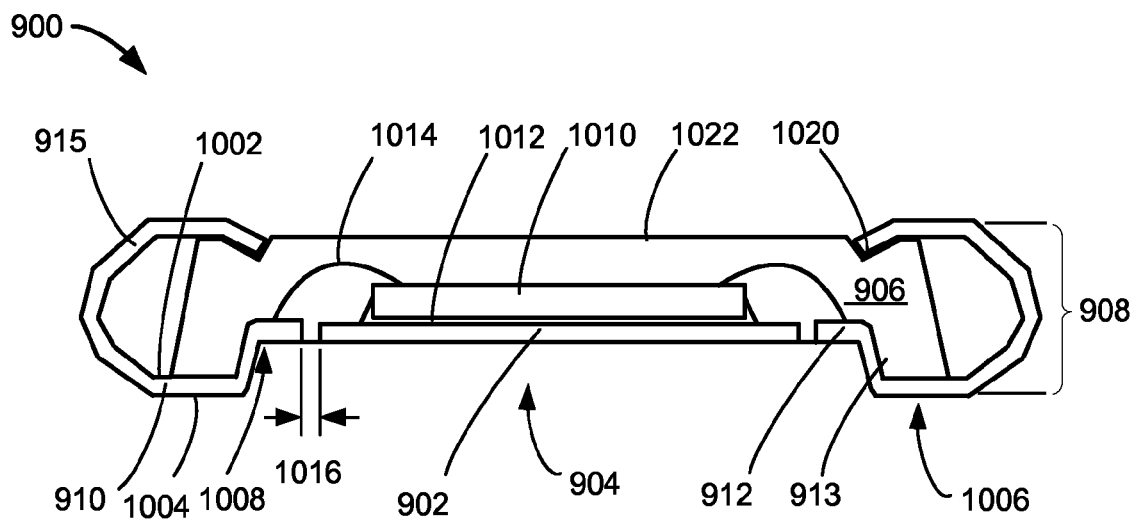
FIG. 10 is a cross-sectional view of the stackable integrated circuit package system along 10-10 of FIG. 9.

Referring now to FIG. 10, therein is shown a cross-sectional view of the stackable integrated circuit package system 900 along 10-10 of FIG. 9. The cross-sectional view depicts the paddle 902 between the external interconnects 908. Each of the external interconnects 908 has the interconnect transition portion 913 between the interconnect non-recessed portion 910 and the interconnect recessed portion 912. The interconnect non-recessed portion 910 is below the interconnect recessed portion 912. The paddle 902 is substantially coplanar with the interconnect recessed portion 912.

The cross-sectional view also depicts the encapsulation 906 covering a first surface 1002 of the external interconnects 908 except for the interconnect curved portion 915. The external interconnects 908 have a second surface 1004 at a side opposite the first surface 1002. The second surface 1004 may be further described with a non-recessed surface 1006 and a recessed surface 1008. The non-recessed surface 1006 is along the interconnect non-recessed portion 910. The recessed surface 1008 is along the interconnect recessed portion 912. The cross-sectional view further depicts that the encapsulation 906 exposes the second surface 1004.

An integrated circuit die 1010 mounts on the paddle 902 with an adhesive 1012, such as a die-attach adhesive. The encapsulation 906 exposes a side of the paddle 902 opposite the integrated circuit die 1010. Internal interconnects 1014, such as bond wires or ribbon bond wires, connect the integrated circuit die 1010 and the external interconnects 908.

The encapsulation 906 also covers the integrated circuit die 1010 and the internal interconnects 1014. The encapsulation 906 also fills gaps 1016 between the external interconnects 908 and the paddle 902, wherein the encapsulation 906 do not enter the recess 904 from the gaps 1016. The encapsulation 906 has notches 1020 from a horizontal side 1022 of the encapsulation 906 for locking in and supporting the interconnect curved portion 915 of the external interconnects 908. The interconnect curved portion 915 bends from the interconnect non-recessed portion 910 to over the encapsulation 906 and into the notches 1020. The interconnect curved portion 915 may provide connection sites. The encapsulation 906 and the notches 1020 may allow the external interconnects 908 to provide resilient connections.

Figure 11:
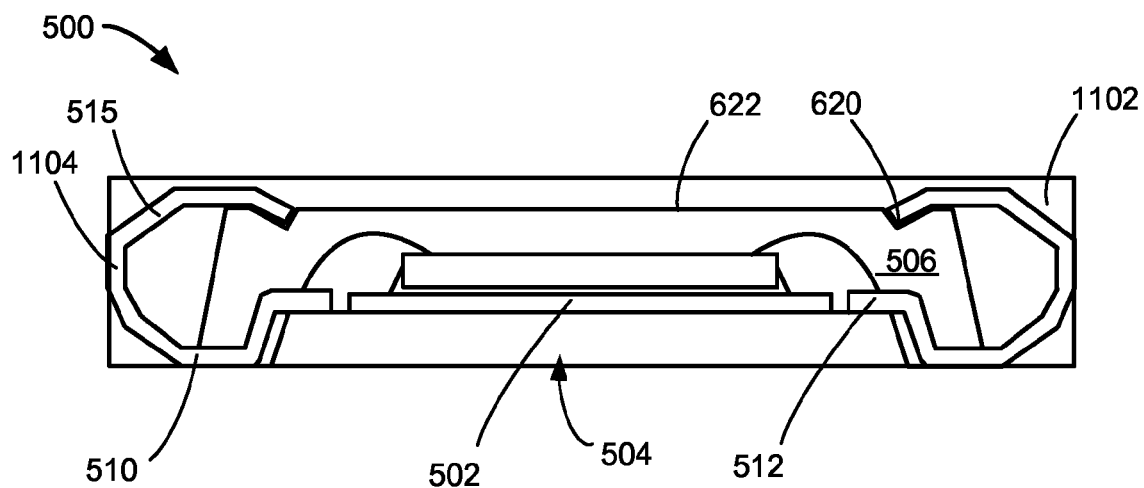
FIG. 11 is a cross-sectional view of the stackable integrated circuit package system of FIG. 6 in a package encapsulation.

Referring now to FIG. 11, therein is shown a cross-sectional view of the stackable integrated circuit package system 500 of FIG. 6 in a package encapsulation 1102. The package encapsulation 1102, such as an epoxy mold compound, covers the encapsulation 506 of the stackable integrated circuit package system 500. The package encapsulation 1102 also covers the paddle 502 and the interconnect recessed portion 512 as well as fills the recess 504. The package encapsulation 1102 further covers the horizontal side 622 and the interconnect curved portion 515 over the encapsulation 506 and in the notches 620.

The package encapsulation 1102 exposes the interconnect non-recessed portion 510 and a peripheral side 1104 of the interconnect curved portion 515. For illustrative purposes, the package encapsulation 1102 is shown covering the interconnect curved portion 515 over the encapsulation 506, although it is understood that the package encapsulation 1102 may expose the interconnect curved portion 515 over the encapsulation 506. The package encapsulation 1102 limits connection sites to the stackable integrated circuit package system 500.

Figure 12:
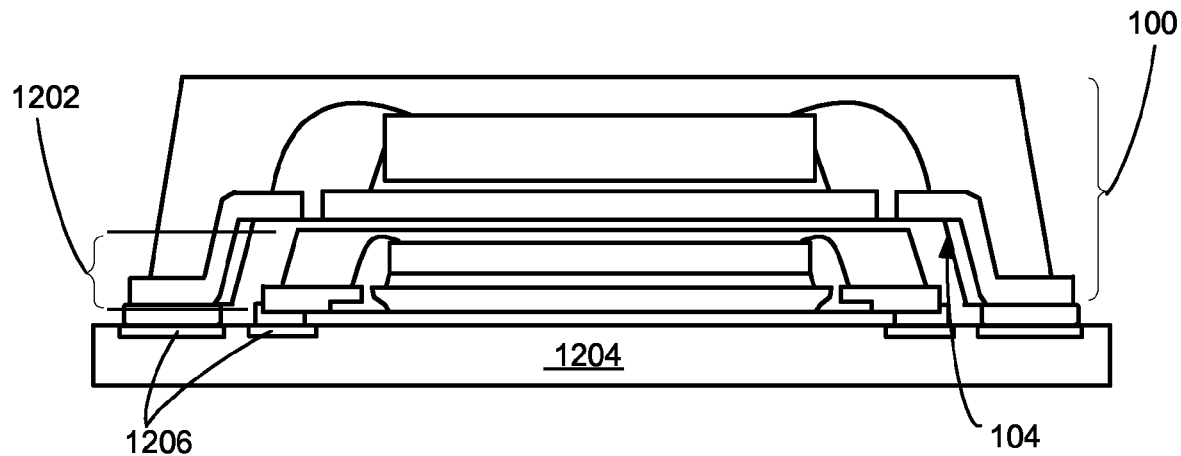
FIG. 12 is a cross-sectional view of the stackable integrated circuit package system of FIG. 2 in a stacked configuration.

Referring now to FIG. 12, therein is shown a cross-sectional view of the stackable integrated circuit package system 100 of FIG. 2 in a stacked configuration. The cross-sectional view depicts a device 1202, such as an integrated circuit package system, mounting over a next system level 1204, such as printed circuit board. The stackable integrated circuit package system 100 mounts over the next system level 1204 and over the device 1202. The device 1202 is in the recess 104.

The stackable integrated circuit package system 100 and the device 1202 connect to contacts 1206, such as contact sites, of the next system level 1204. The stacked configuration depicted exemplifies a stacking option with the embodiments of the stackable integrated circuit package system 100 for increasing integrated circuit density while reducing the horizontal dimension required.

Figure 13:
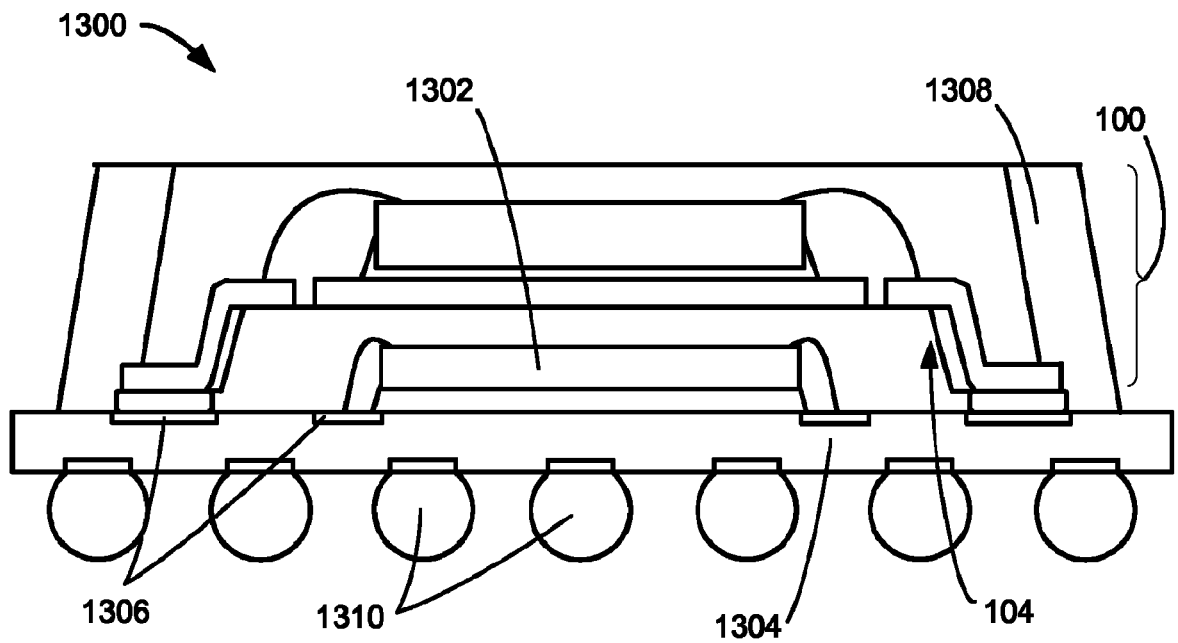
FIG. 13 is a cross-sectional view of an integrated circuit package-in-package system having the stackable integrated circuit package system of FIG. 2.

Referring now to FIG. 13, therein is shown a cross-sectional view of an integrated circuit package-in-package system 1300 having the stackable integrated circuit package system 100 of FIG. 2. The cross-sectional view depicts a device 1302, such as an integrated circuit die, mounting over a carrier 1304, such as a ball grid array laminate substrate.

The stackable integrated circuit package system 100 mounts over the carrier 1304 and over the device 1302. The device 1302 is in the recess 104.

The stackable integrated circuit package system 100 and the device 1302 connect to contacts 1306, such as contact sites, of the carrier 1304. A package encapsulation 1308, such as an epoxy mold compound, covers the stackable integrated circuit package system 100 and the device 1302 as well as fills the recess 104. Package interconnects 1310, such as solder balls, connect with the carrier 1304 on a side opposite the device 1302.

Figure 14:
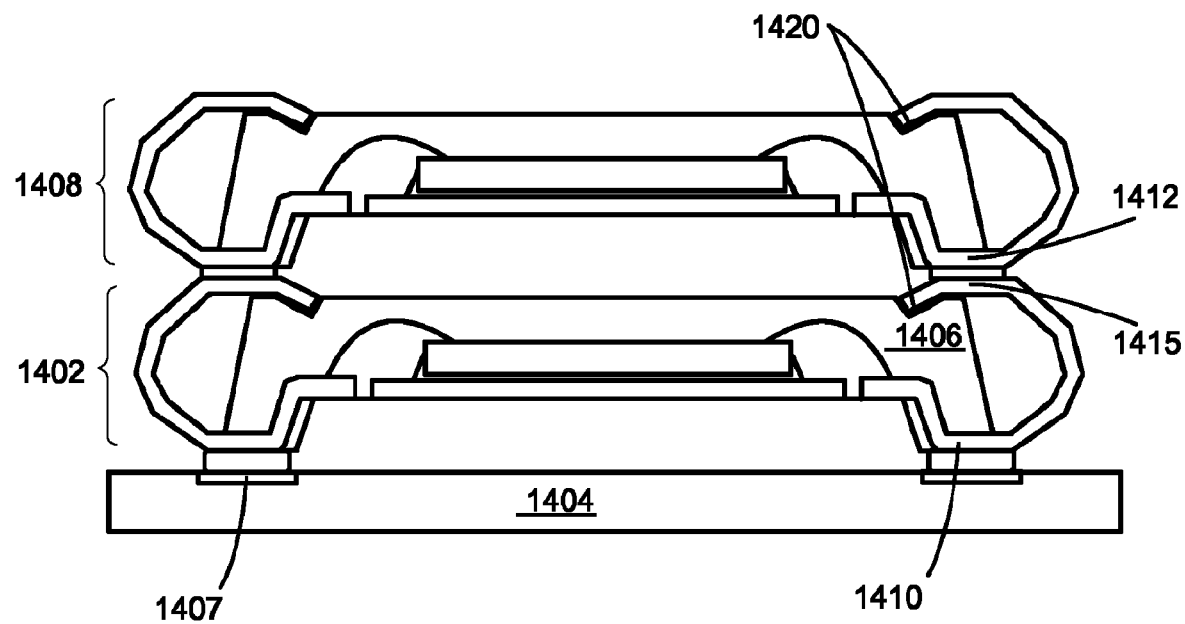
FIG. 14 is a cross-sectional view of the stackable integrated circuit package system of FIG. 6 in a stacked configuration.

Referring now to FIG. 14, therein is shown a cross-sectional view of the stackable integrated circuit package system 500 of FIG. 6 in a stacked configuration. The cross-sectional view depicts a first stackable integrated circuit package system 1402 mounting over a next system level 1404, such as printed circuit board. A first interconnect non-recessed portion 1410 connects to a contact 1407, such as contact sites, of the next system level 1404.

A second stackable integrated circuit package system 1408 mounts over the first stackable integrated circuit package system 1402. A second interconnect non-recessed portion 1412 of the second stackable integrated circuit package system 1408 connects with a first interconnect curved portion 1415 of the first stackable integrated circuit package system 1402. Notches 1420 and an encapsulation 1406 of the first stackable integrated circuit package system 1402 supports the first interconnect curved portion 1415.

The stacked configuration depicted exemplifies a stacking option with the embodiments of the stackable integrated circuit package system 500 for increasing integrated circuit density while reducing the horizontal dimension required. The stackable integrated circuit package system 500 may represent the first stackable integrated circuit package system 1402 and the second stackable integrated circuit package system 1408.

Figure 15:
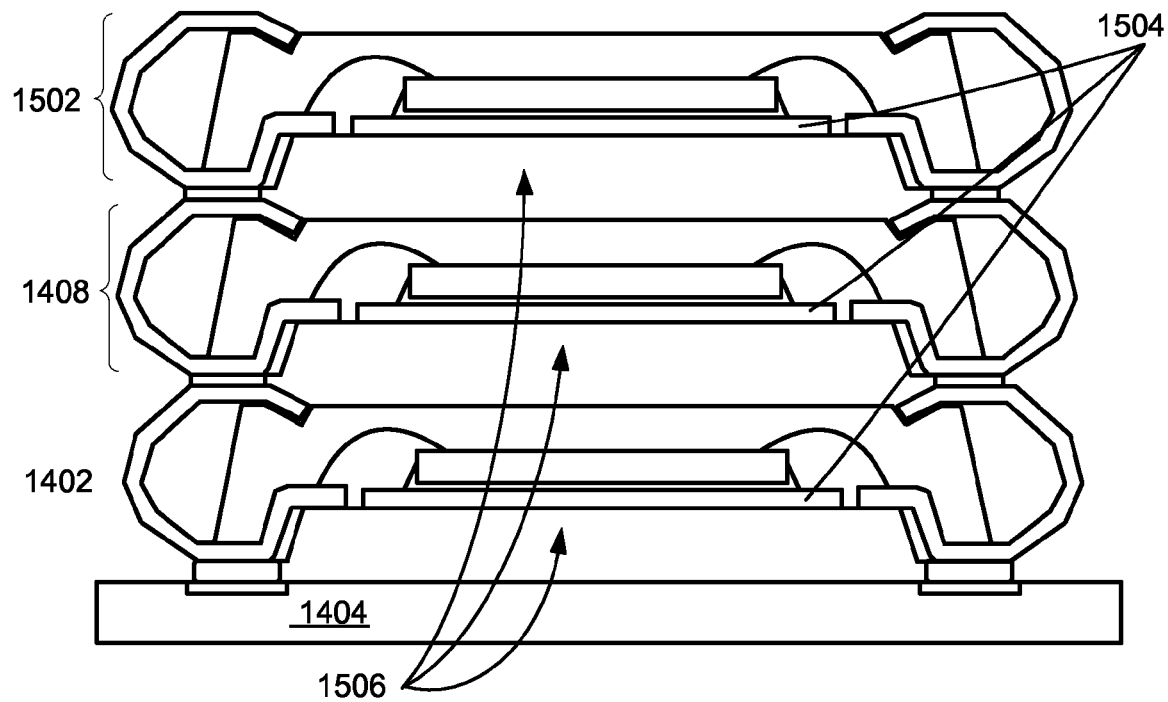
FIG. 15 is the structure of FIG. 14 in another stacked configuration.

Referring now to FIG. 15, therein is shown the structure of FIG. 14 in another stacked configuration. This cross-sectional view depicts the first stackable integrated circuit package system 1402 over the next system level 1404 and the second stackable integrated circuit package system 1408 over the first stackable integrated circuit package system 1402. A third stackable integrated circuit package system 1502 is over the second stackable integrated circuit package system 1408.

As the stacked configuration grows with more devices, such as the stackable integrated circuit package system 500 of FIG. 6, thermal concentration becomes a concern. A paddle 1504 from each of the first stackable integrated circuit package system 1402, the second stackable integrated circuit package system 1408, and the third stackable integrated circuit package system 1502 may function as a heat sink or heat spreader.

A recess 1506 from each of the first stackable integrated circuit package system 1402, the second stackable integrated circuit package system 1408, and the third stackable integrated circuit package system 1502 may function as cooling channels allowing heat to flow from the paddle 1504 into the recess 1506.

Figure 16:
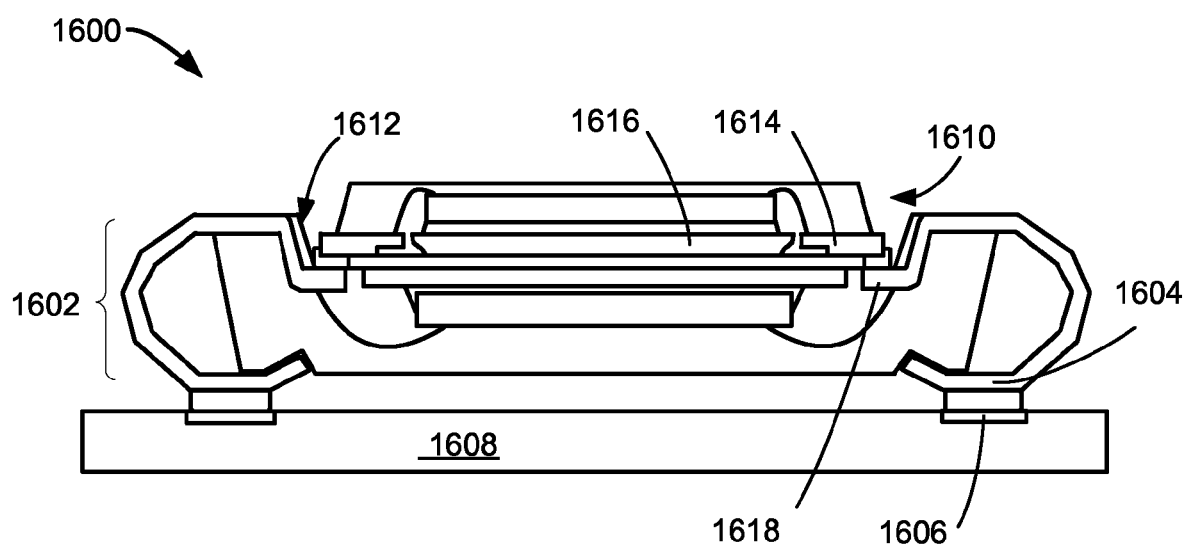
FIG. 16 is a cross-sectional view of an integrated circuit package-on-package system having the stackable integrated circuit package system of FIG. 7.

Referring now to FIG. 16, therein is shown a cross-sectional view of an integrated circuit package-on-package system 1600 having the stackable integrated circuit package system 500 of FIG. 7. The cross-sectional view depicts a first stackable integrated circuit package system 1602, such as the stackable integrated circuit package system 500 in an inverted orientation, with an interconnect curved portion 1604 mounting over contacts 1606 of a next system level 1608, such as a printed circuit board.

A device 1610, such as an integrated circuit package system, mounts in a first recess 1612 of the first stackable integrated circuit package system 1602. The device 1610 has interconnects 1614, such as leads, and a support structure 1616, such as die-attach paddle. The interconnects 1614 may connect to an interconnect recessed portion 1618 of the first stackable integrated circuit package system 1602. The support structure 1616 may be connected to ground such that the support structure 1616 may function as an electromagnetic interference (EMI) shield.

Figure 17:
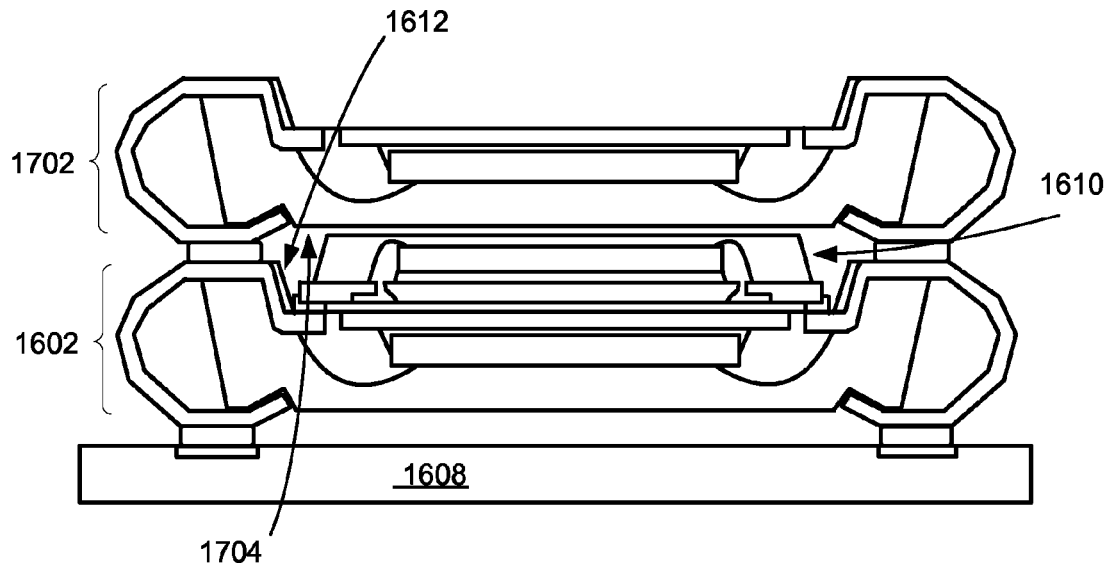
FIG. 17 is the structure of FIG. 16 in a stacked configuration with the stackable integrated circuit package system of FIG. 6.

Referring now to FIG. 17, therein is shown the structure of FIG. 16 in a stacked configuration with the stackable integrated circuit package system 500 of FIG. 6. The first stackable integrated circuit package system 1602 is over the next system level 1608 and the device 1610 is in the first recess 1612.

A second stackable integrated circuit package system 1702, such as the stackable integrated circuit package system 500, mounts over the first stackable integrated circuit package system 1602. The device 1610 is also in a second recess 1704 of the second stackable integrated circuit package system 1702.

This stacked configuration further exemplifies the stacking options with the embodiments of the stackable integrated circuit package system 500. This stacked configuration increases the integrated density while reducing the horizontal space required. Further, this stacked configuration also provides airflow between the first stackable integrated circuit package system 1602 and the next system level 1608 as well as within the channel formed by the first recess 1612 and the second recess 1704. These airflow paths allow the embodiments of the stackable integrated circuit package system 500 to form dense stacks while providing thermal dissipation solutions.

Figure 18:
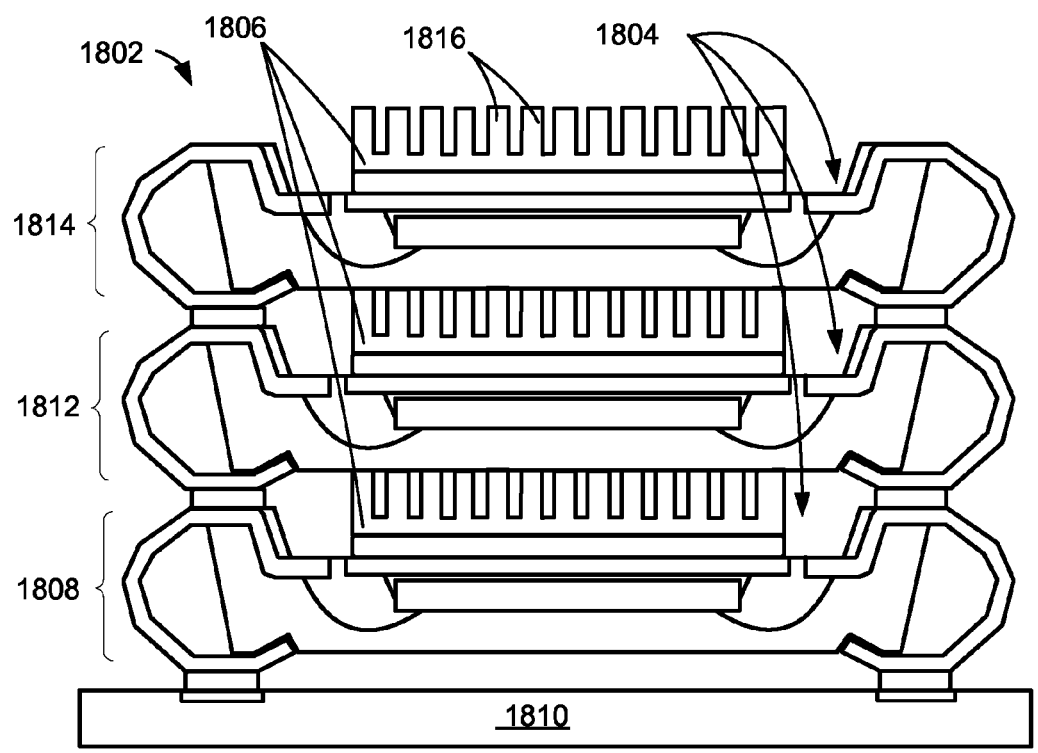
FIG. 18 is a cross-sectional view of the stackable integrated circuit package system of FIG. 7 in a heat dissipating stacked configuration.

Referring now to FIG. 18, therein is shown a cross-sectional view of the stackable integrated circuit package system 500 of FIG. 7 in a heat dissipating stacked configuration. The cross-sectional view depicts a thermally enhanced stack 1802 having recesses 1804 and heat spreaders 1806 in the recesses 1804.

The thermally enhanced stack 1802 has a first stackable integrated circuit package system 1808 over a next system level 1810, such as printed circuit board. The thermally enhanced stack 1802 continues with a second stackable integrated circuit package system 1812 over the first stackable integrated circuit package system 1808 and a third stackable integrated circuit package system 1814 over the second stackable integrated circuit package system 1812. The stackable integrated circuit package system 500 of FIG. 6 in an inverted orientation may represent the first stackable integrated circuit package system 1808, the second stackable integrated circuit package system 1812, and the third stackable integrated circuit package system 1814.

The heat spreaders 1806 provides thermal conduction paths away from the first stackable integrated circuit package system 1808, the second stackable integrated circuit package system 1812, and the third stackable integrated circuit package system 1814. The heat spreaders 1806 have fins 1816 providing more surface area for heat dissipation to ambient.

Figure 19:
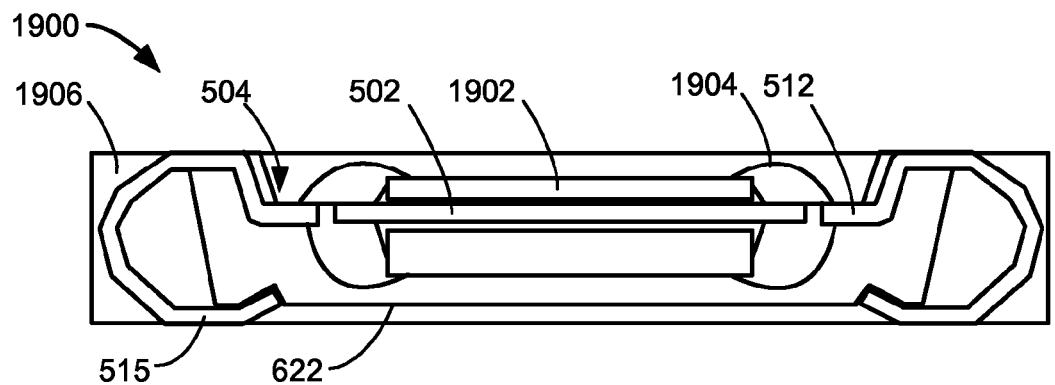
FIG. 19 is a cross-sectional view of an integrated circuit package-in-package system with the stackable integrated circuit package system of FIG. 7.

Referring now to FIG. 19, therein is shown a cross-sectional view of an integrated circuit package-in-package system 1900 with the stackable integrated circuit package system 500 of FIG. 7. The cross-sectional view depicts a device 1902, such as an integrated circuit die, mounted over the paddle 502 and in the recess 504. Interconnects 1904, such as bond wires or ribbon bond wires, connect the device 1902 and the interconnect recessed portion 512.

A package encapsulation 1906 encloses the stackable integrated circuit package system 500, the device 1902, and the interconnects 1904. The package encapsulation 1906 exposes the interconnect curved portion 515 under the horizontal side 622 the stackable integrated circuit package system 500.

Figure 20:
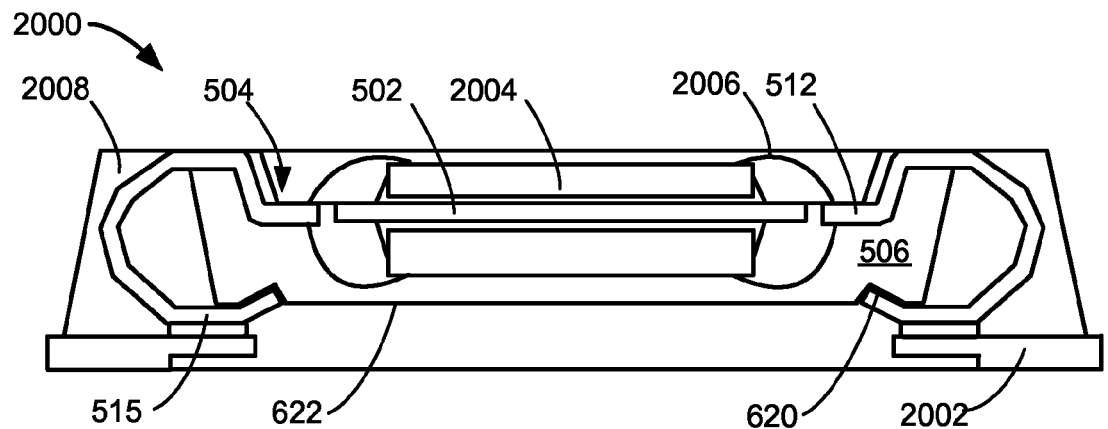
FIG. 20 is a cross-sectional view of an integrated circuit package-in-package system with the stackable integrated circuit package system of FIG. 7 over terminals.

Referring now to FIG. 20, therein is shown a cross-sectional view of an integrated circuit package-in-package system 2000 with the stackable integrated circuit package system 500 of FIG. 7 over terminals 2002. The cross-sectional view depicts a device 2004, such as an integrated circuit die, mounted over the paddle 502 and in the recess 504. Interconnects 2006, such as bond wires or ribbon bond wires, connect the device 2004 and the interconnect recessed portion 512.

The stackable integrated circuit package system 500 mounts over the terminals 2002, such as leads. The interconnect curved portion 515 connects to the terminals 2002 and supported by the encapsulation 506. The notches 620 in the encapsulation 506 help lock the interconnect curved portion 515 in place.

A package encapsulation 2008 encloses the stackable integrated circuit package system 500, the device 2004, and the interconnects 2006 over the terminals 2002. The package encapsulation 2008 exposes the terminals 2002 on a side opposite the stackable integrated circuit package system 500.

Figure 21:
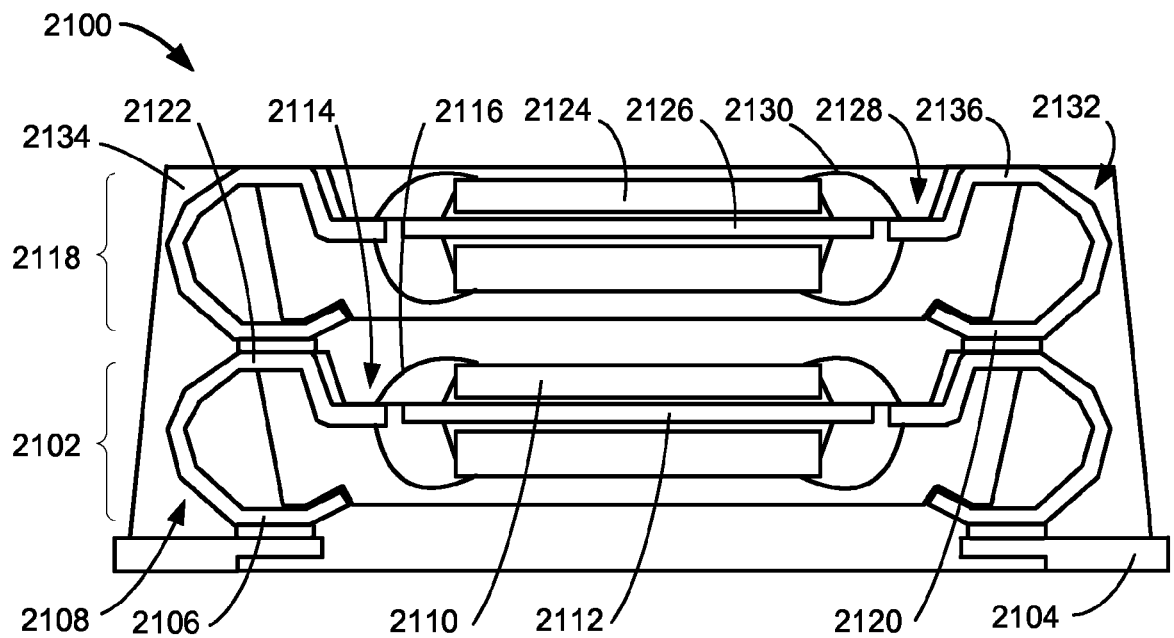
FIG. 21 is a cross-sectional view of an integrated circuit package-in-package system with the stackable integrated circuit package system of FIG. 7 in a stacked configuration.

Referring now to FIG. 21, therein is shown a cross-sectional view of an integrated circuit package-in-package system 2100 with the stackable integrated circuit package system 500 of FIG. 7 in a stacked configuration. A first stackable integrated circuit package system 2102, such as the stackable integrated circuit package system 500 of FIG. 7, mounts over terminals 2104, such as leads. A first interconnect curved portion 2106 of first external interconnects 2108 mounts over the terminals 2104.

A first integrated circuit die 2110 mounts over a first paddle 2112 and in a first recess 2114, both of the first stackable integrated circuit package system 2102. First interconnects 2116, such as bond wires or ribbon bond wires, connect the first integrated circuit die 2110 and the first external interconnects 2108 in the first recess 2114.

A second stackable integrated circuit package system 2118, such as the stackable integrated circuit package system 500, mounts over the first stackable integrated circuit package system 2102. A second interconnect curved portion 2120 mounts over a first interconnect non-recessed portion 2122 of the first stackable integrated circuit package system 2102.

A second integrated circuit die 2124 mounts over a second paddle 2126 and in a second recess 2128, both of the second stackable integrated circuit package system 2118. Second interconnects 2130, such as bond wires or ribbon bond wires, connect the second integrated circuit die 2124 and second external interconnects 2132 in the second recess 2128. The stackable integrated circuit package system 500 may represent the first stackable integrated circuit package system 2102, the second stackable integrated circuit package system 2118, or both.

A package encapsulation 2134, such as an epoxy mold compound, encloses the first stackable integrated circuit package system 2102, the first integrated circuit die 2110, the first interconnects 2116, the second stackable integrated circuit package system 2118, the second integrated circuit die 2124, and the second interconnects 2130 over the terminals 2104. The package encapsulation 2134 exposes a second interconnect non-recessed portion 2136 of the second stackable integrated circuit package system 2118 for further connections.

For illustrative purposes, the package encapsulation 2134 is described as exposing the second interconnect non-recessed portion 2136, although it is understood that the package encapsulation 2134 may not expose the second interconnect non-recessed portion 2136. Also for illustrative purposes, the package encapsulation 2134 is described enclosing the first interconnect curved portion 2106 of the first stackable integrated circuit package system 2102, although it is understood that the package encapsulation 2134 may expose the first interconnect curved portion 2106. Further for illustrative purposes, the package encapsulation 2134 is described enclosing the second interconnect curved portion 2120 of the second stackable integrated circuit package system 2118, although it is understood that the package encapsulation 2134 may expose the second interconnect curved portion 2120.

Figure 22:
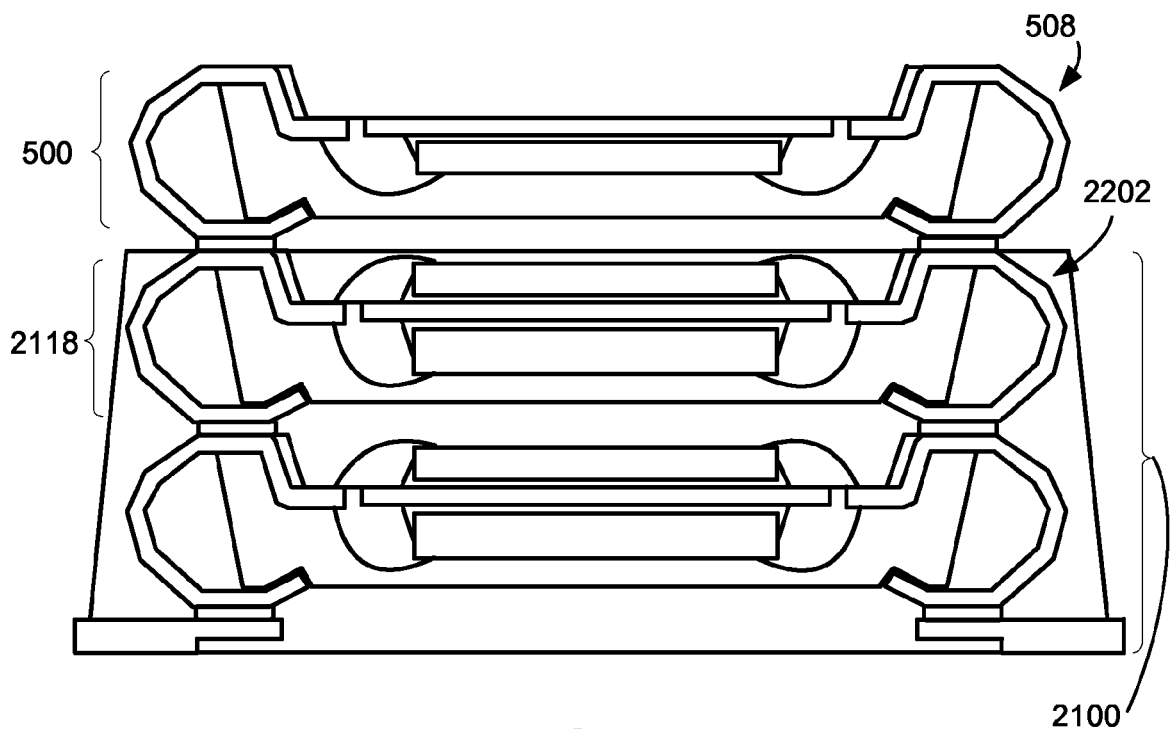
FIG. 22 is the structure of FIG. 21 mounted with the stackable integrated circuit package system of FIG. 7.

Referring now to FIG. 22, therein is shown the structure of FIG. 21 mounted with the stackable integrated circuit package system 500 of FIG. 7. The stackable integrated circuit package system 500 may be stacked over the integrated circuit package-in-package system 2100. The external interconnects 508 of the stackable integrated circuit package system 500 mounts over second external interconnects 2202 of the second stackable integrated circuit package system 2118.

For illustrative purposes, the stackable integrated circuit package system 500 is shown mounted in the inverted configuration, although it is understood that the stackable integrated circuit package system 500 may not be inverted. Also for illustrative purposes, the stackable integrated circuit package system 500 is shown mounted over the integrated circuit package-in-package system 2100, although it is understood that other devices may stack over the integrated circuit package-in-package system 2100.

Figure 23:
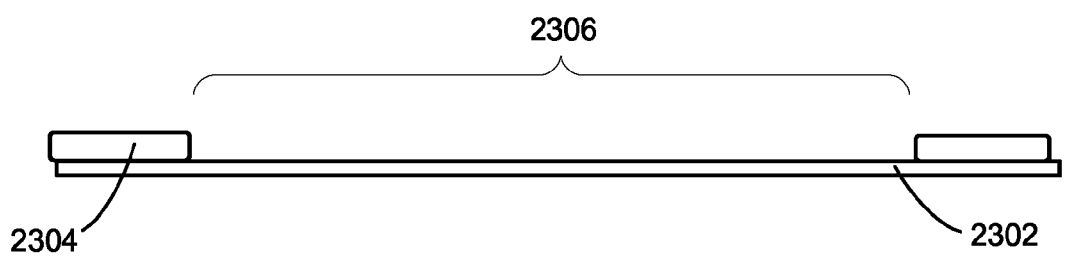
FIG. 23 is the structure of FIG. 19 in a taping phase.

Referring now to FIG. 23, therein is shown the structure of FIG. 19 in a taping phase. A tape 2302, such as a coverlay tape, attaches to a frame 2304, such as a base frame, forming a planar surface*. For illustrative purposes, the frame 2304 is shown with an opening 2306, although it is understood that the frame 2304 may have more than one of the opening 2306.

Figure 24:
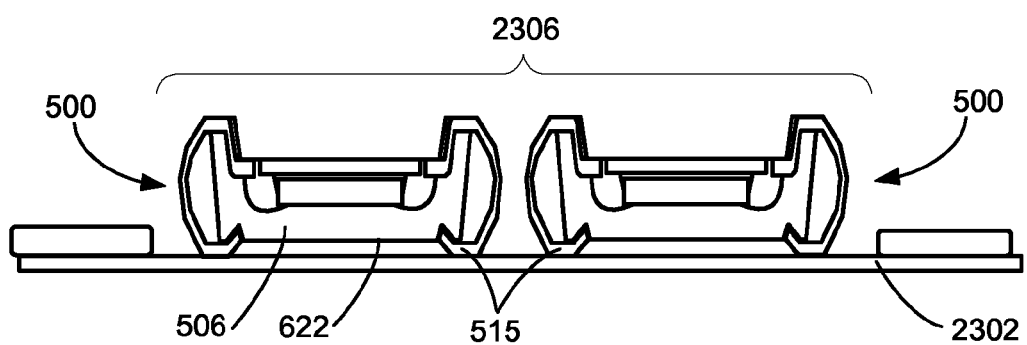
FIG. 24 is the structure of FIG. 23 in a mounting phase.

Referring now to FIG. 24, therein is shown the structure of FIG. 23 in a mounting phase. A plurality of the stackable integrated circuit package system 500 in the inverted configuration mount on the tape 2302 within the opening 2306. The interconnect curved portion 515 under the horizontal side 622 of the encapsulation 506 attaches on the tape 2302.

For illustrative purposes, the plurality of the stackable integrated circuit package system 500 is shown as inverted, although it is understood that the plurality of the stackable integrated circuit package system 500 may not be inverted. Also for illustrative purposes, the plurality of the stackable integrated circuit package system 500 is shown mounted on the tape 2302, although it is understood that a number of embodiments may be mounted onto the tape 2302.

Figure 25:
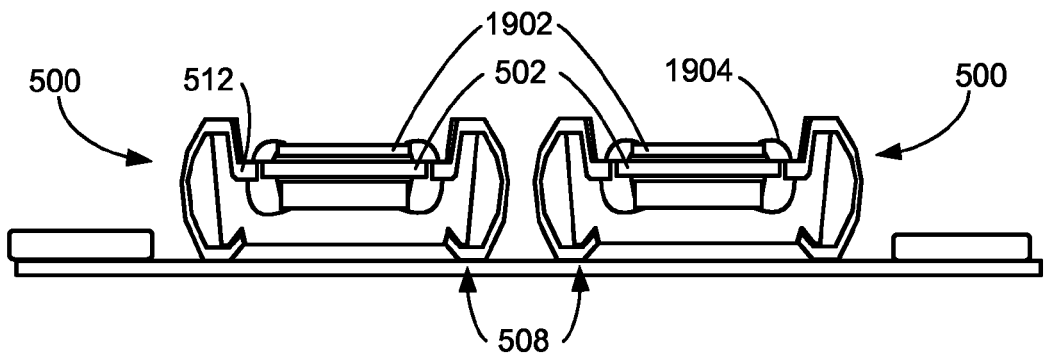
FIG. 25 is the structure of FIG. 24 in a stacking phase.

Referring now to FIG. 25, therein is shown the structure of FIG. 24 in a stacking phase. The device 1902, such as an integrated circuit die, mounts over the paddle 502 and in the recess 504 of the stackable integrated circuit package system 500. The interconnects 1904, such as bond wires or ribbon bond wires, connect the device 1902 and the interconnect recessed portion 512 of the external interconnects 508.

Figure 26:
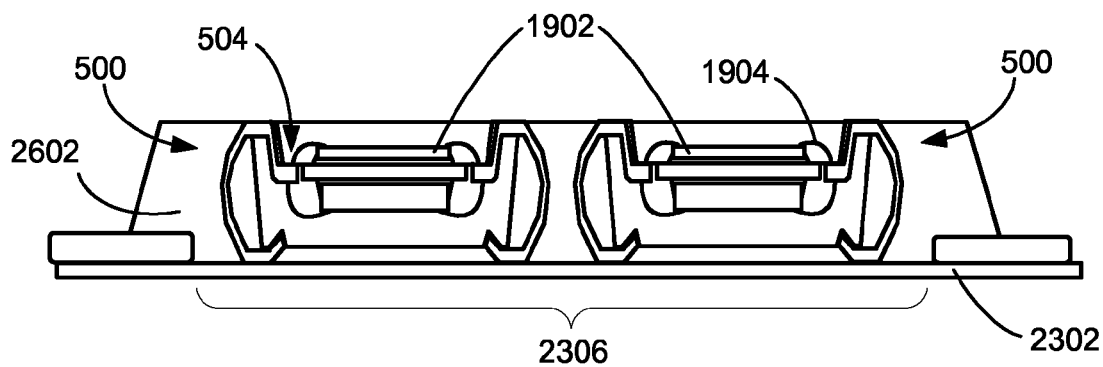
FIG. 26 is the structure of FIG. 25 in a molding phase.

Referring now to FIG. 26, therein is shown the structure of FIG. 25 in a molding phase. A frame encapsulation 2602, such as an epoxy mold compound, is formed over the plurality of the stackable integrated circuit package system 500, the plurality the device 1902, the interconnects 1904, and the tape 2302 in the opening 2306. The frame encapsulation 2602 fills the recess 504 of the plurality of the stackable integrated circuit package system 500.

Figure 27:
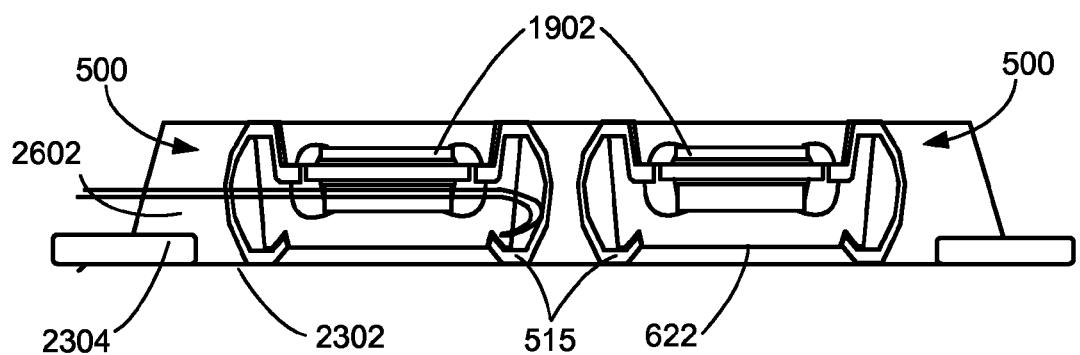
FIG. 27 is the structure of FIG. 26 in a de-taping phase.

Referring now to FIG. 27, therein is shown the structure of FIG. 26 in a de-taping phase. The tape 2302 is removed with the frame encapsulation 2602 and the frame 2304 providing structural support to the plurality of the stackable integrated circuit package system 500, the plurality of the device 1902, and the interconnects 1904. The removal process exposes the interconnect curved portion 515 below the horizontal side 622 of the stackable integrated circuit package system 500.

Figure 28:
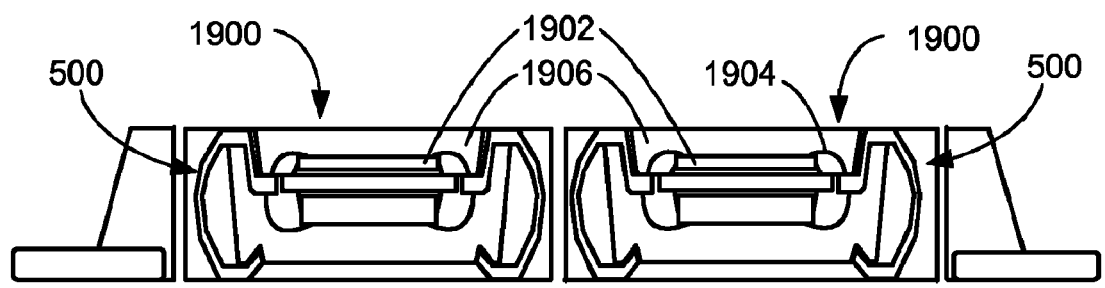
FIG. 28 is the structure of FIG. 27 in a singulating phase.

Referring now to FIG. 28, therein is shown the structure of FIG. 27 in a singulating phase. The plurality of the stackable integrated circuit package system 500 with the device 1902 and the interconnects 1904 undergo singulation forming the integrated circuit package-in-package system 1900 with the package encapsulation 1906.

Figure 29:
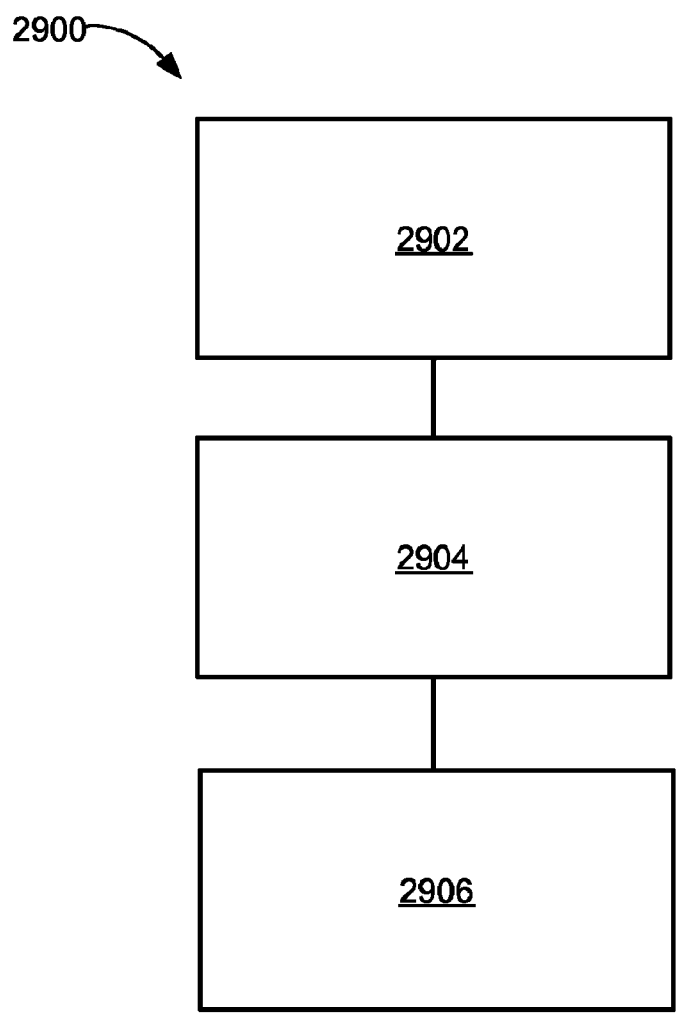
FIG. 29 is a flow chart of a stackable integrated circuit package system for manufacture of the stackable integrated circuit package system in an embodiment of the present invention.

Referring now to FIG. 29, therein is shown a flow chart of a stackable integrated circuit package system 2900 for manufacture of the stackable integrated circuit package system 100 in an embodiment of the present invention. The system 2900 includes forming an external interconnect having an interconnect non-recessed portion and an interconnect recessed portion in a block 2902; mounting an integrated circuit die over a paddle that is coplanar with the interconnect recessed portion in a block 2904; and forming an encapsulation having a recess over the external interconnect and the integrated circuit die with the external interconnect exposed at a side of the encapsulation in a block 2906.

Yet other important aspects of the embodiments include that it valuably supports and services the historical trend of reducing costs, simplifying systems, and increasing performance.

These and other valuable aspects of the embodiments consequently further the state of the technology to at least the next level.

Thus, it has been discovered that the stackable integrated circuit package system of the present invention furnishes important and heretofore unknown and unavailable solutions, capabilities, and functional aspects for improving reliability in systems. The resulting processes and configurations are straightforward, cost-effective, uncomplicated, highly versatile, and effective, can be implemented by adapting known technologies, and are thus readily suited for efficiently and economically manufacturing stackable integrated circuit package system.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method for manufacturing a stackable integrated circuit package system comprising:
   forming an external interconnect having a planar first non-recessed surface of an interconnect non-recessed portion and an interconnect recessed portion;
   providing a paddle adjacent the external interconnect;
   mounting an integrated circuit die over the paddle; and
   forming an encapsulation over the integrated circuit die with a portion of the planar first non-recessed surface near an end of the external interconnect exposed and a coplanar portion away from the end covered by the encapsulation, the encapsulation having a recess exposing the paddle.

2. The method as claimed in claim 1 wherein:
   forming the external interconnect having the interconnect non-recessed portion and the interconnect recessed portion includes:
      forming the external interconnect having an interconnect transition portion between the interconnect non-recessed portion and the interconnect recessed portion; and
   forming the encapsulation further includes:
      covering the interconnect transition portion.

3. The method as claimed in claim 1 wherein forming the external interconnect includes forming an interconnect curved portion from the interconnect non-recessed portion over a horizontal side of the encapsulation.

4. The method as claimed in claim 1 further comprising placing a device in the recess.

5. The method as claimed in claim 1 further comprising stacking a first stackable integrated circuit package system below a second stackable integrated circuit package system.

6. A method for manufacturing a stackable integrated circuit package system comprising:
   forming an external interconnect having a planar first non-recessed surface of an interconnect non-recessed portion and an interconnect recessed portion with an interconnect transition portion in between;
   providing a paddle for die-attach and coplanar with the interconnect recessed portion mounting an integrated circuit die over the paddle;
   connecting the integrated circuit die and the external interconnect; and
   forming an encapsulation over the integrated circuit die with only a portion of the planar first non-recessed surface near an end of the external interconnect exposed and a coplanar portion away from the end covered by the encapsulation, the encapsulation having a recess exposing the paddle.

7. The method as claimed in claim 6 further comprising mounting a heat spreader in the recess.

8. The method as claimed in claim 6 further comprising:
   placing a device in the recess; and
   forming a package encapsulation around the device.

9. The method as claimed in claim 6 wherein:
   forming the external interconnect includes:
      forming an interconnect curved portion from the interconnect non-recessed portion over a horizontal side of the encapsulation; and
   further comprising:
      forming a package encapsulation around the stackable integrated circuit package system with the with the interconnect curved portion exposed.

10. The method as claimed in claim 6 further comprising:
    stacking the stackable integrated circuit package system over a terminal;
    stacking a device over the paddle in the recess; and
    forming a package encapsulation around the stackable integrated circuit package system and the device with the interconnect non-recessed portion exposed.

11. A stackable integrated circuit package system comprising:
    an external interconnect having a planar first non-recessed surface of an interconnect non-recessed portion and an interconnect recessed portion;
    a paddle adjacent the external interconnect;
    an integrated circuit die over the paddle; and
    an encapsulation over the integrated circuit die with portions of the planar first non-recessed surface near an end of the external interconnect exposed and a coplanar portion away from the end covered by the encapsulation, the encapsulation having a recess exposing the paddle.

12. The system as claimed in claim 11 wherein the external interconnect includes an interconnect transition portion between the interconnect non-recessed portion and the interconnect recessed portion with the interconnect transition portion in the encapsulation.

13. The system as claimed in claim 11 wherein the external interconnect includes an interconnect curved portion from the interconnect non-recessed portion over a horizontal side of the encapsulation.

14. The system as claimed in claim 11 further comprising a device in the recess.

15. The system as claimed in claim 11 further comprising a first stackable integrated circuit package system below a second stackable integrated circuit package system.

16. The system as claimed in claim 11 wherein:
the external interconnect is a lead with the interconnect non-recessed portion and the interconnect recessed portion;
the paddle is a die-attach paddle coplanar with the interconnect recessed portion;
the integrated circuit die over the paddle is connected with the external interconnect; and
the encapsulation having the recess is over a first surface of the external interconnect and the integrated circuit die with the external interconnect exposed at the side of the encapsulation and with the paddle exposed in the recess.

17. The system as claimed in claim 16 further comprising a heat spreader in the recess.

18. The system as claimed in claim 16 further comprising:
a device in the recess; and
a package encapsulation around the device.

19. The system as claimed in claim 16 wherein
the external interconnect includes:
an interconnect curved portion from the interconnect non-recessed portion over a horizontal side of the encapsulation; and
further comprising:
a package encapsulation around the stackable integrated circuit package system with the with the interconnect curved portion exposed.

20. The system as claimed in claim 16 further comprising:
the stackable integrated circuit package system over a terminal;
a device over the paddle in the recess; and
a package encapsulation around the stackable integrated circuit package system and the device with the interconnect non-recessed portion exposed.

* * * * *